United States Patent
Wang et al.

(10) Patent No.: US 12,004,392 B2
(45) Date of Patent: *Jun. 4, 2024

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Benlian Wang, Beijing (CN); Li Wang, Beijing (CN); Yipeng Chen, Beijing (CN); Yueping Zuo, Beijing (CN); Zheng Liu, Beijing (CN)

(73) Assignees: CHENGDU BOE OPTOELECTRONICS TECHNOLOGY CO., LTD., Sichuan (CN); BOE TECHNOLOGY GROUP CO., LTD, Beijing (CN)

( * ) Notice: Subject to any disclaimer, the term of this patent is extended or adjusted under 35 U.S.C. 154(b) by 324 days.

This patent is subject to a terminal disclaimer.

(21) Appl. No.: 17/473,602

(22) Filed: Sep. 13, 2021

(65) Prior Publication Data

US 2021/0408214 A1  Dec. 30, 2021

Related U.S. Application Data

(63) Continuation-in-part of application No. 15/779,664, filed as application No. PCT/CN2017/109710 on Nov. 7, 2017, now Pat. No. 11,127,806.

(30) Foreign Application Priority Data

Apr. 28, 2017  (CN) .......................... 201710294993.1

(51) Int. Cl.
*H10K 59/131*  (2023.01)

(52) U.S. Cl.
CPC .................................. *H10K 59/131* (2023.02)

(58) Field of Classification Search
CPC ..................................................... H10K 59/131
See application file for complete search history.

(56) References Cited

U.S. PATENT DOCUMENTS

| 11,127,806 B2 * | 9/2021 | Wang .................. H10K 77/111 |
| 2007/0020445 A1 * | 1/2007 | Liu ...................... D03D 15/258 |
| | | 427/331 |

(Continued)

FOREIGN PATENT DOCUMENTS

| CN | 105144270 | 12/2015 |
| CN | 205140985 | 4/2016 |

(Continued)

OTHER PUBLICATIONS

Office action from Chinese Application No. 201710294993.1 dated May 17, 2019.

(Continued)

*Primary Examiner* — J. E. Schoenholtz
(74) *Attorney, Agent, or Firm* — Calfee, Halter & Griswold LLP

(57) ABSTRACT

A display panel and a display device are provided. The display panel comprises a substrate, a plurality of sub-pixels, a plurality of data lines, a plurality of wiring structures and a plurality of pads. The substrate comprises a display area and a non-display area comprising a bending area. The sub-pixels and data lines are in the display area and electrically connected with each other. The wiring structures are in the bending area and electrically connected with the data lines. At least one wiring structure comprises a plurality of hollow patterns connected successively, each hollow pattern comprises a first conductive part and a second conductive part connected with each other. The plurality of pads are in the non-display area and located on a side of the plurality of (Continued)

wiring structures away from the display area and electrically connected with the plurality of wiring structures.

19 Claims, 5 Drawing Sheets

(56) References Cited

U.S. PATENT DOCUMENTS

| | | | |
|---|---|---|---|
| 2012/0062447 A1 | 3/2012 | Tseng et al. | |
| 2013/0034971 A1 | 2/2013 | Tsai et al. | |
| 2014/0216786 A1 | 8/2014 | Zhou et al. | |
| 2014/0217373 A1 | 8/2014 | Youn et al. | |
| 2015/0179728 A1 | 6/2015 | Kwon et al. | |
| 2015/0378484 A1 | 12/2015 | Orita et al. | |
| 2016/0087024 A1 | 3/2016 | Son et al. | |
| 2016/0093644 A1 | 3/2016 | Ki et al. | |
| 2016/0103534 A1 | 4/2016 | Zhang et al. | |
| 2017/0023816 A1 | 1/2017 | Maede et al. | |
| 2017/0192574 A1 | 7/2017 | Koike et al. | |
| 2017/0262109 A1* | 9/2017 | Choi | H10K 59/122 |
| 2017/0332670 A1 | 11/2017 | Wang et al. | |
| 2021/0167158 A1 | 6/2021 | Wang et al. | |
| 2022/0254866 A1* | 8/2022 | Kim | H10K 59/131 |

FOREIGN PATENT DOCUMENTS

| | | |
|---|---|---|
| CN | 105870152 | 8/2016 |
| CN | 106020528 | 10/2016 |
| CN | 106371251 | 2/2017 |
| CN | 107039396 | 8/2017 |
| JP | 2004-119871 | 4/2004 |
| JP | 2009-259929 | 11/2009 |
| WO | 2014/117478 | 8/2014 |
| WO | 2014/136455 | 9/2014 |
| WO | 2016/039047 | 3/2016 |

OTHER PUBLICATIONS

Office action from Chinese Application No. 201710294993.1 dated Sep. 20, 2019.
Office action from Chinese Application No. 201910847817.5 dated Sep. 1, 2020.
Office action from Chinese Application No. 201910847817.5 dated Apr. 19, 2021.
Office action from Chinese Application No. 201710294993.1 dated Nov. 5, 2018.
International Search Report from PCT/CN2017/109710 dated Feb. 2, 2018.
Written Opinion from PCT/CN2017/109710 dated Feb. 2, 2018.
Office action from U.S. Appl. No. 15/779,664 dated Mar. 30, 2021.

* cited by examiner

DISPLAY PANEL AND DISPLAY DEVICE

CROSS REFERENCE OF RELATED APPLICATIONS

The present application is a continuation-in-part application based on an U.S. patent application Ser. No. 15/779,664 filed on May 29, 2018 which is the national stage entry of PCT/CN2017/109710, filed Nov. 7, 2017 and claims the right of priority to the Chinese Patent Application No. 201710294993.1 filed on Apr. 28, 2017, the entire disclosures of which are incorporated herein by reference.

TECHNICAL FIELD

This disclosure relates to the field of display technology, particularly to a display panel and a display device.

BACKGROUND

In order to manufacture a flexible display device, many display components made of organic materials have been developed, such as organic light emitting layers, organic passivation layers and polymer substrates (e.g. PI substrates) as flexible substrates. But it is difficult to replace the metal wiring in the display device with a wiring made of organic materials, because the electrical conductivity of organic materials is far lower than the metal wiring. However, when the flexible display device is bent, the metal wiring in the display panel might be broken (the broken wiring ratio is about 1%), which results in failure of the display device.

SUMMARY

An embodiment of the disclosure provides a display panel, comprising: a substrate comprising a display area and a non-display area on at least one side of the display area, the non-display area comprising a bending area; a plurality of sub-pixels in the display area; and a plurality of data lines located in the display area and electrically connected with the plurality of sub-pixels; a plurality of wiring structures located in the bending area and electrically connected with the plurality of data lines. At least one of the plurality of wiring structures comprises a plurality of hollow patterns connected successively, each hollow pattern of the hollow patterns comprises a first conductive part having a first pattern and a second conductive part having a second pattern, wherein the first conductive part and the second conductive part are connected with each other, and the first pattern and the second pattern have different shapes. The display panel further comprises a plurality of pads in the non-display area. The plurality of pads are located on a side of the plurality of wiring structures away from the display area and electrically connected with the plurality of wiring structures.

According to some embodiments of the disclosure, the first conductive part and the second conductive part of the hollow pattern both comprise a first terminal and a second terminal, the first terminal of the first conductive part is connected with the first terminal of the second conductive part, and the second terminal of the first conductive part is connected with the second terminal of the second conductive part, such that first conductive part and the second conductive part are connected with each other to form a closed pattern.

According to some embodiments of the disclosure, the first conductive part comprises a bending segment, the second conductive part comprises an arc segment, a length of the bending segment extends between the first terminal and the second terminal of the first conductive part, a length of the arc segment extends between the first terminal and the second terminal of the second conductive part, such that the bending segment and the arc segment form the closed pattern.

According to some embodiments of the disclosure, the closed pattern comprises an opening, a shape of the opening comprises at least one selected form a group consisting of an ellipse, a circle, a pentagon, a hexagon and an irregular shape.

According to some embodiments of the disclosure, for two adjacent hollow patterns of the plurality of hollow patterns, the first terminal of the first conductive part in one of the two adjacent hollow patterns is connected with the second terminal of the first conductive part in the other one of the two adjacent hollow patterns, and the first terminal of the second conductive part in the one of the two adjacent hollow patterns is connected with the second terminal of the second conductive part in the other one of the two adjacent hollow patterns.

According to some embodiments of the disclosure, the first conductive part and the second conductive part of each hollow pattern of the plurality of hollow patterns are connected with each other to form at least three connection nodes, the at least three connection nodes are not in a same straight line, According to some embodiments of the disclosure, the first conductive part comprises a first sub-conductive portion and a second sub-conductive portion, each of the first sub-conductive portion, the second sub-conductive portion and the second conductive part comprises a first terminal and a second terminal, and a length of each of the first sub-conductive portion, the second sub-conductive portion and the second conductive part extends between respective first terminal and respective second terminal. In each hollow pattern of the plurality of hollow patterns, the first terminal of the first sub-conductive portion is connected with the first terminal of the second conductive part to form a first connection node of the at least three connection nodes, the second terminal of the first sub-conductive portion is connected with the first terminal of the second sub-conductive portion to form a second connection node of the at least three connection nodes, and the second connection node is connected to a position between the first terminal and the second terminal of the second conductive part, the second terminal of the second sub-conductive portion is connected with the second terminal of the second conductive part to form a third connection node of the at least three connection nodes.

According to some embodiments of the disclosure, for any two adjacent hollow patterns of the plurality of hollow patterns, the first connection node formed by the first terminal of the first sub-conductive portion in one of the two adjacent hollow patterns and the first terminal of the second conductive part in the one of the two adjacent hollow patterns is connected with the third connection node formed by the second terminal of the second sub-conductive portion in the other hollow pattern of the two adjacent hollow patterns and the second terminal of the second conductive part in the other hollow pattern.

According to some embodiments of the disclosure, each of the first sub-conductive portion, the second sub-conductive portion and the second conductive part comprises an arc shape.

According to some embodiments of the disclosure, any two adjacent hollow patterns of the plurality of hollow patterns form a centrally symmetric pattern.

According to some embodiments of the disclosure, any two adjacent hollow patterns of the plurality of hollow patterns form an axially symmetric pattern.

According to some embodiments of the disclosure, a plurality of first conductive parts of the plurality of hollow patterns comprising the first conductive part form an integrated structure.

According to some embodiments of the disclosure, a plurality of second conductive parts of the plurality of hollow patterns comprising the second conductive part form an integrated structure.

According to some embodiments of the disclosure, the display panel further comprises a plurality of first fan-out wires between the display area and the bending area, each of the plurality of first fan-out wires is electrically connected with a corresponding data line of the plurality of data lines and a corresponding wiring structure of the plurality of wiring structures, respectively.

According to some embodiments of the disclosure, the display panel further comprises a plurality of second fan-out wires, the plurality of second fan-out wires is located between the plurality of pads and the plurality of wiring structures and electrically connected with the plurality of pads and the plurality of wiring structures.

According to some embodiments of the disclosure, at least some of the plurality of wiring structures comprises a first sub-wiring and a second sub-wiring, the first sub-wiring and the second sub-wiring are connected in parallel with each other.

According to some embodiments of the disclosure, each of the first sub-wiring and the second sub-wiring comprises a first terminal and a second terminal, the first terminal of the first sub-wiring and the first terminal of the second sub-wiring are connected with a corresponding first fan-out wire of the plurality of first fan-out wires, the second terminal of the first sub-wiring and the second terminal of the second sub-wiring are connected with a corresponding second fan-out wire of the plurality of second fan-out wires.

Another embodiment of the disclosure provides a display device, comprising the display panel according to any one of the foregoing embodiments.

DETAILED DESCRIPTION OF EMBODIMENTS

In order to enable the skilled person in the art to better understand the technical solutions of embodiments of this disclosure, in the following, the embodiments of this disclosure will be described in more details in conjunction with the drawings and the examples.

Figure 1:
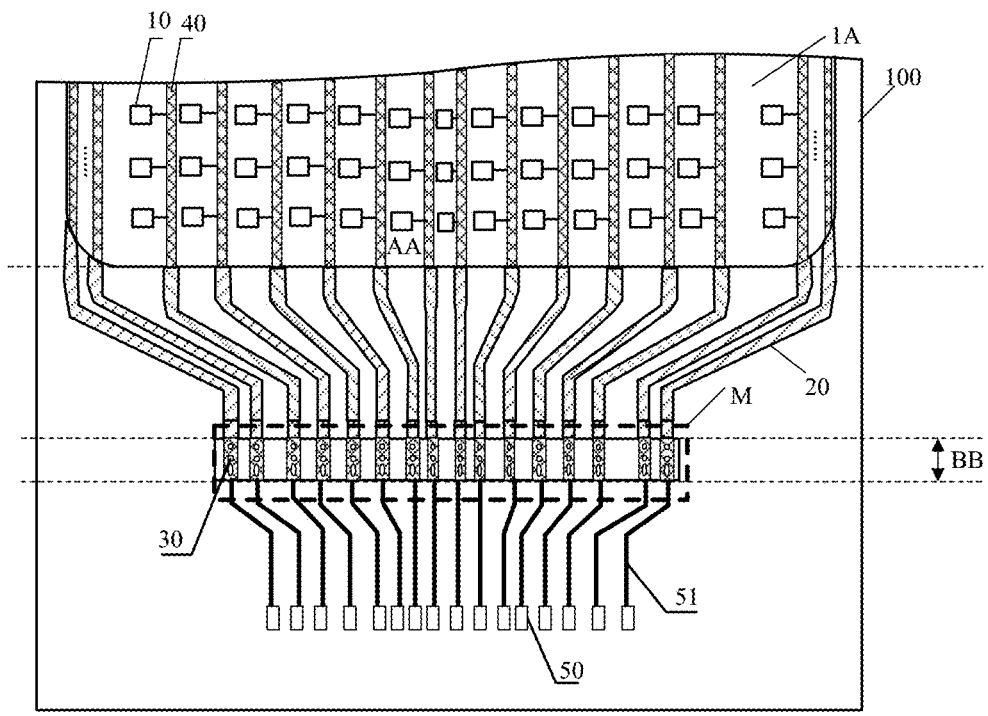
FIG. 1 is a schematic partial view of a display panel according to an embodiment of the disclosure, where the bending area is not bent.
Figure 2:
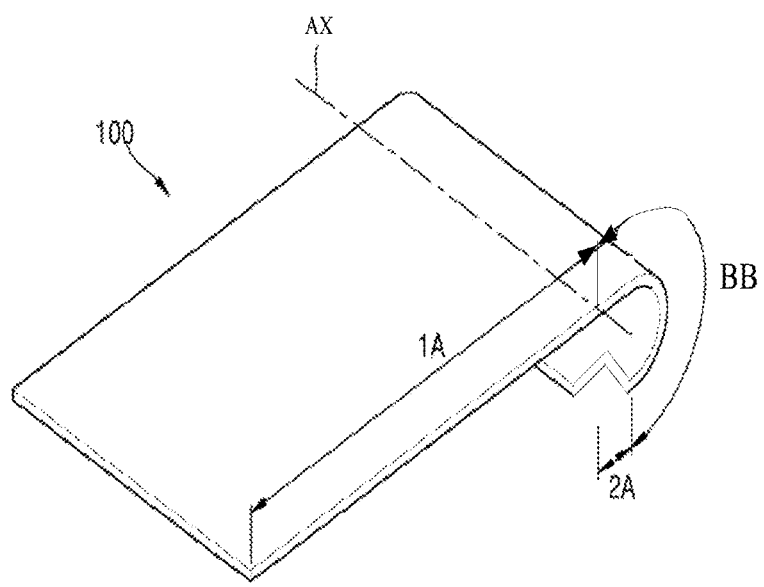
FIG. 2 illustrates the display panel of FIG. 1 where the bending area is bent.

Referring to FIGS. 1 and 2, a display panel according to an embodiment of the disclosure comprises a substrate 100, the substrate 100 comprises a display area 1A and a non-display area on at least one side of the display area 1A. The non-display area comprises a bending area BB. FIGS. 1 and 2 respectively illustrate a first state of the display panel in which the bending area BB is not bent and a second state of the display panel in which the bending area BB is bent. In case the bending area BB is bent, the substrate 100 forms a main portion including the display area 1A and a back portion 2A extending from the main portion via the bending area BB towards a back surface of the main portion. A bending axis of the bending area BB is indicated as AX in FIG. 2, which is parallel to an edge of the substrate. The substrate may bend around the bending axis AX, such that the back portion 2A extends towards the back surface of the main portion. With the bending area BB bent, the main portion and the back portion 2A may form any suitable angle, which is not restricted herein.

The display panel further comprises a plurality of sub-pixels 10 and a plurality of data lines 40 in the display area 1A, the data lines 40 are electrically connected with the plurality of sub-pixels 10. As shown in FIG. 1, the display panel further comprises a plurality of wiring structures 30 and a plurality of pads 50, the wiring structures 30 are located in the bending area BB and electrically connected with the data lines 40. At least one of the plurality of wiring structures 30 comprises a plurality of hollow patterns connected successively, each hollow pattern of the hollow patterns comprises a first conductive part having a first pattern and a second conductive part having a second pattern. The first conductive part and the second conductive part are connected with each other, and the first pattern and the second pattern have different shapes. The plurality of pads 50 are in the non-display area, specifically, the pads 50 are located on a side of the plurality of wiring structures away from the display area 1A and electrically connected with the plurality of wiring structures 30.

Since the display panel provided by the embodiment of the disclosure comprises the above-defined wiring structures, the display panel can release the stress through the hollow patterns of the wiring structures in the process of bending, stretching and twisting, so as to avoid breaking of the wiring structures that may result in failure of the devices on the substrate. Particularly for a flexible display panel, due to its characteristic of being easily bending, the wiring structures described in the embodiment of this disclosure can improve the yield of the flexible display panel greatly. Additionally, the pads 50 may be configured to electrically connect with an integrated circuit, for example, the pads 50 may be connected with a source driver so that data signals are supplied when the display panel is in operation. According to some embodiments, as shown in FIG. 2, the pads are located on the back portion 2A when the bending area BB is bent. Next, the wiring structures in the display panel provided by the embodiments of the disclosure will be set forth in detail by way of examples.

As shown in FIG. 3 to FIG. 9, at least some of the wiring structures in the display panel provided by some embodiments of the disclosure comprise a plurality of hollow patterns 1 connected successively, each hollow pattern 1 of the hollow patterns comprises a first conductive part 11 having a first pattern and a second conductive part 12 having a second pattern, the first conductive part 11 and the second conductive part 12 are connected with each other, and the first pattern and the second pattern have different shapes.

Because the wiring structure comprises a plurality of hollow patterns connected successively, compared with a conventional linear type wiring structure, the wiring structure described in the embodiment of this disclosure can release the stress through the hollow patterns in the process of bending, stretching and twisting, so as to avoid breaking of the wiring structure that may result in failure of the devices on the substrate of the display panel. Moreover, the first conductive part 11 and the second conductive part 12 in each hollow pattern 1 have different shapes, hence, even if the conductive part of one shape in the wiring structure is broken in the process of bending, stretching and twisting, the conductive part of the other shape can ensure good conductivity for the wiring structure. Particularly for a flexible substrate, due to its characteristic of being easily bending, using the wiring structure proposed in the embodiment of this disclosure can improve the yield of the flexible substrate greatly.

Figure 3:
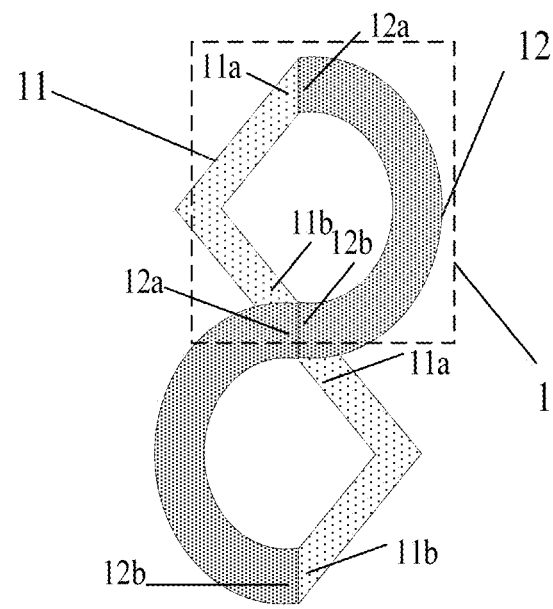
FIG. 3 is a schematic view of two adjacent hollow patterns of the wiring structure in a display panel provided by another embodiment of this disclosure.
Figure 4:
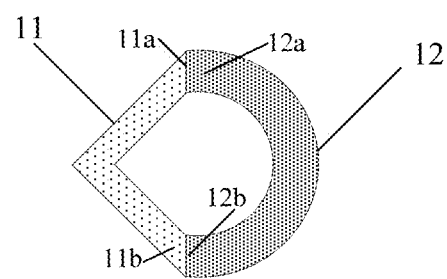
FIG. 4 is a schematic view of a single hollow pattern of the wiring structure in a display panel provided by another embodiment of this disclosure.

In an example, as shown in FIG. 3 and FIG. 4, the first conductive part 11 and the second conductive part 12 of each hollow pattern 1 of the wiring structure both comprise a first terminal 11a, 12a and a second terminal 11b, 12b. The first terminal 11a of the first conductive part 11 is connected with the first terminal 12a of the second conductive part 12, and the second terminal 11b of the first conductive part 11 is connected with the second terminal 12b of the second conductive part 12. That is, the first conductive part 11 and the second conductive part 12 are connected with each other to form a closed hollow pattern 1. The hollow pattern 1 comprises two connection nodes, i.e., a connection node formed by the first terminal 11a of the first conductive part 11 and the first terminal 12a of the second conductive part 12, and another connection node formed by the second terminal 12b of the first conductive part 11 and the second terminal 12b of the second conductive part 12.

Moreover, as shown in FIG. 3, for two adjacent hollow patterns of the wring structure, the first terminal 11a of the first conductive part 11 of one of the two hollow patterns is connected with the second terminal 11b of the first conductive part of the other hollow pattern of the two hollow patterns, and the first terminal 12a of the second conductive part 12 in the one of the two hollow patterns is connected with the second terminal 12b of the second conductive part 12 of the other hollow pattern. That is to say, in the wiring structure shown in FIG. 3, the first conductive parts 11 in any adjacent hollow patterns 1 are connected end to end, and the second conductive parts 12 in any adjacent hollow patterns 1 are connected end to end. In this way, any two adjacent hollow patterns 1 of the wiring structure form a centrally symmetric pattern, with a connection node between the two hollow patterns being a center.

According to some embodiments, as shown in FIG. 4, the first conductive part 11 comprises a bending segment, the second conductive part 12 comprises an arc segment, a length of the bending segment extends between the first terminal 11a and the second terminal 11b of the first conductive part, a length of the arc segment extends between the first terminal 12a and the second terminal 12b of the second conductive part, such that the bending segment and the arc segment form the closed pattern.

In some embodiments, the first conductive parts 11 in the hollow patterns of the wiring structure can be an integrated structure, and the second conductive parts 12 in the hollow patterns of the wiring structure can be an integrated structure. In this way, the manufacture of the first conductive part 11 and the second conductive part 12 can be facilitated, and the productivity can be improved greatly.

In the example of FIG. 3, the first conductive part 11 is in a polygonal line shape, and the second conductive part 12 is in an arc shape. As shown in FIG. 3, a plurality of polygonal line shaped first conductive parts 11 are connected end to end, forming a shape similar to a triangular wave, and a plurality of arc shaped second conductive parts 12 are connected end to end to form a shape similar to a sinusoidal wave. Here, the example of FIG. 3 can be considered as combining and splicing two sub-wirings of different shapes into one wiring structure 1, hence, even if the sub-wiring of one shape is broken, the connecting function can also be maintained based on the sub-wiring of the other shape, so as to avoid the problem of failure of the wiring structure due to bending and breaking.

Figure 5:
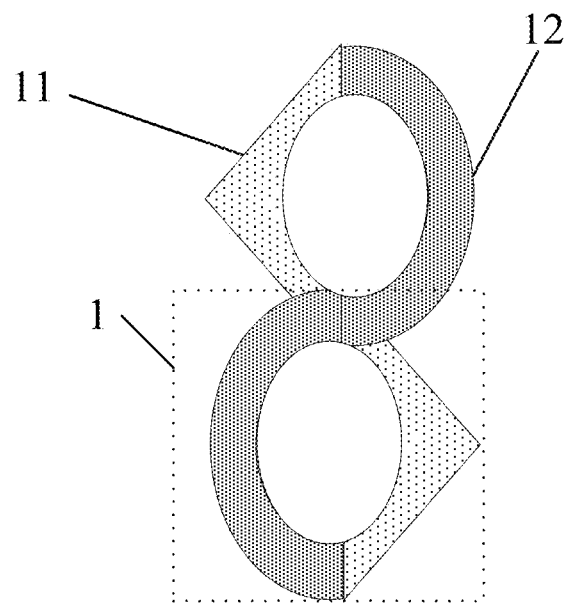
FIG. 5 is a schematic view of two adjacent hollow patterns of the wiring structure in a display panel provided by another embodiment of this disclosure.

As previously mentioned, the first conductive part and the second conductive part of the hollow pattern of the wiring structure are connected with each other to form a closed pattern, further, the closed pattern may comprise an opening. The opening may be in any suitable shape, e.g., a shape of the opening comprises at least one selected form a group consisting of an ellipse, a circle, a pentagon, a hexagon and an irregular shape. FIG. 5 illustrates the closed pattern formed by the first conductive part and the second conductive part of the hollow pattern comprises an ellipse opening.

Figure 6:
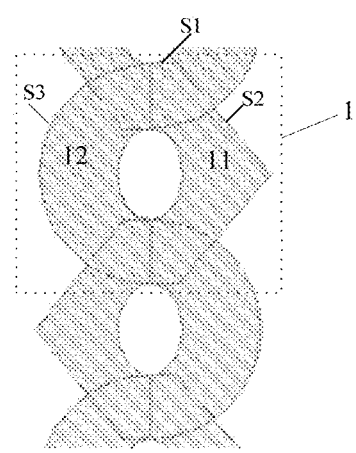
FIG. 6 is a schematic view of two adjacent hollow patterns of the wiring structure in a display panel provided by yet another embodiment of this disclosure.

FIG. 6 illustrates two adjacent hollow patterns of a wiring structure in a display panel according to another embodiment of the disclosure. Similar to the embodiment of FIG. 5, the first conductive part 11 and the second conductive part 12 in a single hollow pattern are connected with each other to form a closed pattern including an ellipse opening. However, an outer contour of the first conductive part 11 is different from that of the first conductive part 11 in FIG. 5. The first conductive part 11 in FIG. 6 may be an axially symmetric structure, with an axis of symmetry passing through a center of the ellipse opening and being substantially perpendicular to a length extension direction of the whole wiring structure. Referring to FIG. 6, the outer contour of the first conductive part 11 includes a first segment S1 and a second segment S2 intersecting with each other. The first segment S1 is connected with an arc outer contour S3 of the second conductive part 12. The first segment S1 may be substantially perpendicular to the length extension direction of the whole wiring structure.

Figure 7:
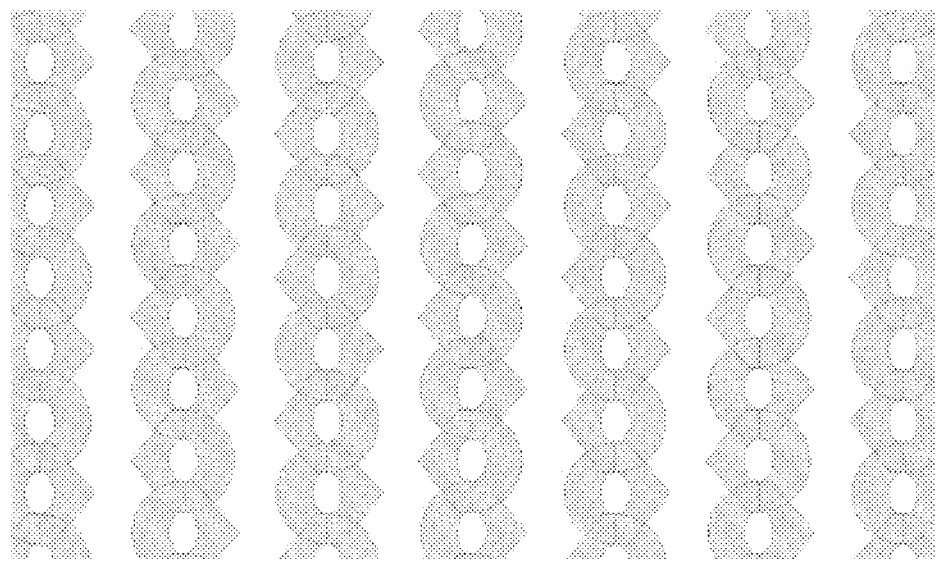
FIG. 7 illustrates an enlarged view of multiple wiring structures in the display panel as shown in FIG. 1 where the bending area is not bent.

FIG. 7 illustrates an enlarged view of multiple wiring structures in the display panel shown in FIG. 1 where the bending area is not bent. Each wiring structure shown in FIG. 7 may be considered as multiple wiring structures of FIG. 6 connected in series.

Figure 8:
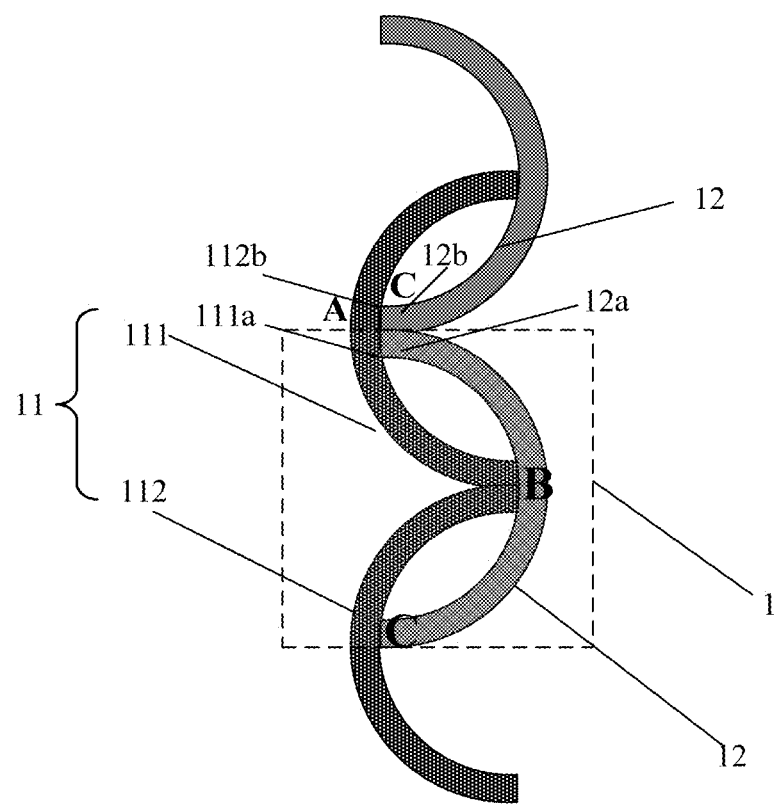
FIG. 8 is a schematic view of the wiring structure in a display panel provided by yet another embodiment of this disclosure.
Figure 9:
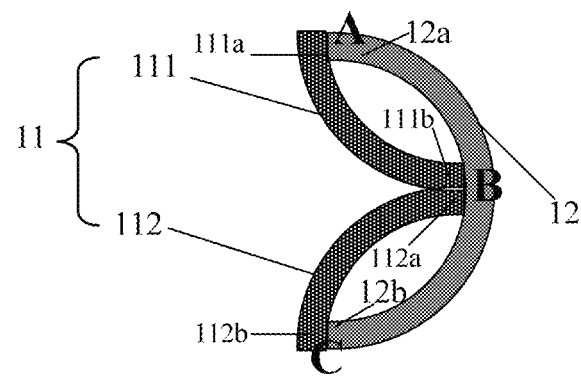
FIG. 9 illustrates a single hollow pattern of the wiring structure of FIG. 8.

According to another embodiment of the disclosure, the first conductive part and the second conductive part of each hollow pattern of the plurality of hollow patterns are connected with each other to form at least three connection nodes, the at least three connection nodes are not in a same straight line. FIGS. 8 and 9 illustrate an example where each hollow pattern comprises three connection nodes formed by the first conductive part 11 and the second conductive part 12. Referring to FIGS. 8 and 9, the first conductive part 11 comprises a first sub-conductive portion 111 and a second sub-conductive portion 112, each of the first sub-conductive portion 111, the second sub-conductive portion 112 and the second conductive part 12 comprises a first terminal 111*a*, 112*a*, 12*a* and a second terminal 111*b*, 112*b*, 12*b*, a length of the first sub-conductive portion 111 extends between the first terminal 111*a* and the second terminal 111*b*, a length of the second sub-conductive portion 112 extends between the first terminal 112*a* and the second terminal 112*b*, and a length of the second conductive portion 12 extends between the first terminal 12*a* and the second terminal 12*b*. In each hollow pattern of the plurality of hollow patterns, the first terminal 111*a* of the first sub-conductive portion 111 is connected with the first terminal 12*a* of the second conductive part 12 to form a first connection node A, the second terminal 111*b* of the first sub-conductive portion 111 is connected with the first terminal 112*a* of the second sub-conductive portion 112 to form a second connection node B, and the second connection node B is connected to a position between the first terminal 12*a* and the second terminal 12*b* of the second conductive part 12. The second terminal 112*b* of the second sub-conductive portion 112 is connected with the second terminal 12*b* of the second conductive part 12 to form a third connection node C. As shown in FIG. 8, for any two adjacent hollow patterns 1 of the plurality of hollow patterns, a first connection node A formed by the first terminal 111*a* of the first sub-conductive portion 111 in one of the two adjacent hollow patterns and the first terminal 12*a* of the second conductive part 12 in the one of the two adjacent hollow patterns is connected with a third connection node C formed by the second terminal 112*b* of the second sub-conductive portion 112 in the other hollow pattern of the two adjacent hollow patterns and the second terminal 12*b* of the second conductive part 12 in the other hollow pattern.

In the example of the hollow pattern as shown in FIG. 9, the first sub-conductive portion 111 and the second sub-conductive portion 112 of the first conductive part 11, as well as the second conductive part 12 are all in an arc shape. Here, it can be seen that there are three connection nodes between the first conductive part 11 and the second conductive part 12 in each hollow pattern 1, i.e., nodes A, B, C as shown in the figure. The nodes A and B are in a same straight line, while the nodes A, B, C are not in a same straight line. Hence, even if the node A and/or the node B are broken, the node C may still keep connection function because it is not in the same straight line as the nodes A and B, so as to avoid failure of the wiring structure.

In some embodiments, as shown in FIG. 8 or 9, any two adjacent hollow patterns 1 of the plurality of hollow patterns form an axially symmetric pattern (an axis of symmetry is a straight line that is perpendicular to the length extension direction of the wiring structure and passes through the connection node between adjacent hollow patterns).

Turning back to FIG. 1, according to some embodiments of the disclosure, the display panel further comprises a plurality of first fan-out wires 20 between the display area 1A and the bending area BB, each of the plurality of first fan-out wires 20 is electrically connected with a corresponding data line 40 of the plurality of data lines and a corresponding wiring structure 30 of the plurality of wiring structures, respectively. Further, in some embodiments, the display panel further comprises a plurality of second fan-out wires 51, the plurality of second fan-out wires 51 are located between the plurality of pads 50 and the plurality of wiring structures 30 and electrically connected with the plurality of pads 50 and the plurality of wiring structures 30. The pads 50 may be electrically connected with an integrated circuit (e.g., a source driver) so that signal from the integrated circuit can be transmitted to the wiring structure 30. If the bending area of the display panel is in a bent state, the second fan-out wires 51 may be located in the back portion 2A shown in FIG. 2. The source driver may be electrically connected to the data lines 10 via the pads 50, the second fan-out wires 51, the wiring structures 30 and the first fan-out wires 20, thereby supplying data signal to the data lines 10.

Figure 10:
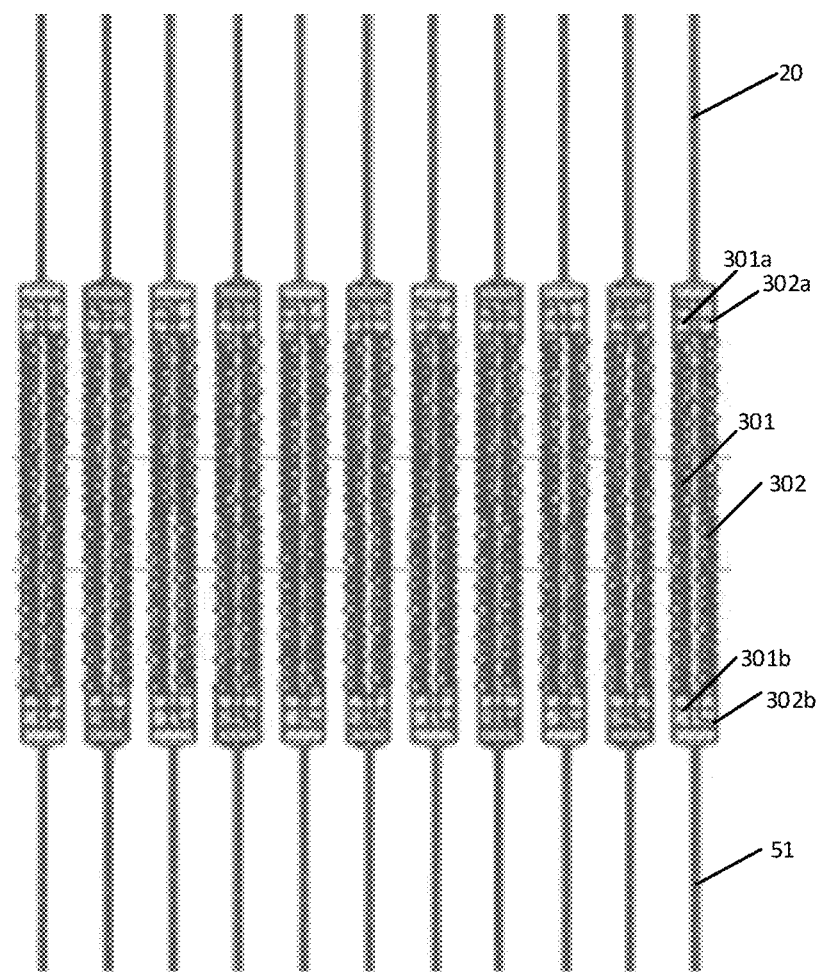
FIG. 10 illustrates the wiring structure and the fan-out wires connected therewith in a display panel according to yet another embodiment.

According to other embodiments of the disclosure, at least some of the plurality of wiring structures comprises a first sub-wiring and a second sub-wiring, the first sub-wiring and the second sub-wiring are connected in parallel with each other, which means a head end of the first sub-wiring is connected with a head end of the second sub-wiring, and a tail end of the first sub-wiring is connected with a tail end of the second sub-wiring, so that a structure comprising the first sub-wiring and second first sub-wiring arranged in parallel is formed. FIG. 10 illustrates wiring structures of a display panel and a portion of the signal lines connected with the wiring structures of the display panel according to yet another embodiment of the disclosure. The position where the structure shown in FIG. 10 is located in the display panel may correspond to the area M indicated with a dotted box in FIG. 1. FIG. 10 shows a portion of first fan-out wires 20, a portion of second fan-out wires 51 and wiring structures connected with the first fan-out wires 20 and the second fan-out wires 51. At least some of the wiring structures comprise a first sub-wiring 301 and a second sub-wiring 302 connected in parallel. Each of the first sub-wiring 301 and the second sub-wiring 302 includes a first terminal 301*a*, 302*a* and a second terminal 301*b*, 302*b*, the first terminal 301*a* of the first sub-wiring and the first terminal 302*a* of the second sub-wiring are connected with a corresponding first fan-out wire 20 of the plurality of first fan-out wires, respectively. A second terminal 301*b* of the first sub-wiring 301 and the second terminal 302*b* of the second sub-wiring 302 are connected with a corresponding second fan-out wiring 51 of the plurality of the second fan-out wires, respectively.

The substrate of the display panel according to the above embodiments may be flexible, i.e., the display panel is a flexible display panel. The display panel may comprise flexible material such as polyimide.

Yet another embodiment of the disclosure provides a display device, comprising the display panel stated in any of the above embodiments. The display device can be a liquid crystal display device or an electroluminescent display device, e.g., any product or component having the display function such as an electronic paper, an OLED panel, a mobile phone, a panel computer, a television, a display, a laptop, a digital photo frame, a navigator etc.

It could be understood that what are stated above are only exemplary embodiments for explaining the principle of the disclosure. However, the scope of the application is not so limited. For the ordinary skilled person in the art, various modifications and improvements can be made without departing from the spirit and the essence of the disclosure. These modifications and improvements shall also be regarded as falling into the scope of the application.

The invention claimed is:

1. A display panel comprising:
a substrate comprising a display area and a non-display area on at least one side of the display area, the non-display area comprising a bending area;
a plurality of sub-pixels in the display area;
a plurality of data lines located in the display area and electrically connected with the plurality of sub-pixels;
a plurality of wiring structures located in the bending area and electrically connected with the plurality of data lines, wherein at least one of the plurality of wiring structures comprises a plurality of hollow patterns connected successively, each hollow pattern of the hollow patterns comprises a first conductive part having a first pattern and a second conductive part having a second pattern, wherein the first conductive part and the second conductive part are connected with each other, and the first pattern and the second pattern have different shapes;
a plurality of pads in the non-display area, wherein the plurality of pads are located on a side of the plurality of wiring structures away from the display area and electrically connected with the plurality of wiring structures, and
wherein the first conductive part and the second conductive part of the hollow pattern both comprise a first terminal and a second terminal, wherein the first terminal of the first conductive part is connected with the first terminal of the second conductive part, and the second terminal of the first conductive part is connected with the second terminal of the second conductive part, such that first conductive part and the second conductive part are connected with each other to form a closed pattern.

2. The display panel according to claim 1, wherein the first conductive part comprises a bending segment, the second conductive part comprises an arc segment, a length of the bending segment extends between the first terminal and the second terminal of the first conductive part, a length of the arc segment extends between the first terminal and the second terminal of the second conductive part, such that the bending segment and the arc segment form the closed pattern.

3. The display panel according to claim 1, wherein the closed pattern comprises an opening, a shape of the opening comprises at least one selected form a group consisting of an ellipse, a circle, a pentagon, a hexagon and an irregular shape.

4. The display panel according to claim 1, wherein for two adjacent hollow patterns of the plurality of hollow patterns, the first terminal of the first conductive part in one of the two adjacent hollow patterns is connected with the second terminal of the first conductive part in the other one of the two adjacent hollow patterns, and the first terminal of the second conductive part in the one of the two adjacent hollow patterns is connected with the second terminal of the second conductive part in the other one of the two adjacent hollow patterns.

5. A display panel comprising:
a substrate comprising a display area and a non-display area on at least one side of the display area, the non-display area comprising a bending area;
a plurality of sub-pixels in the display area;
a plurality of data lines located in the display area and electrically connected with the plurality of sub-pixels;
a plurality of wiring structures located in the bending area and electrically connected with the plurality of data lines, wherein at least one of the plurality of wiring structures comprises a plurality of hollow patterns connected successively, each hollow pattern of the hollow patterns comprises a first conductive part having a first pattern and a second conductive part having a second pattern, wherein the first conductive part and the second conductive part are connected with each other, and the first pattern and the second pattern have different shapes;
a plurality of pads in the non-display area, wherein the plurality of pads are located on a side of the plurality of wiring structures away from the display area and electrically connected with the plurality of wiring structures, and
wherein the first conductive part and the second conductive part of each hollow pattern of the plurality of hollow patterns are connected with each other to form at least three connection nodes, the at least three connection nodes are not in a same straight line.

6. The display panel according to claim 5, wherein the first conductive part comprises a first sub-conductive portion and a second sub-conductive portion, each of the first sub-conductive portion, the second sub-conductive portion and the second conductive part comprises a first terminal and a second terminal, and a length of each of the first sub-conductive portion, the second sub-conductive portion and the second conductive part extends between respective first terminal and respective second terminal,
wherein in each hollow pattern of the plurality of hollow patterns, the first terminal of the first sub-conductive portion is connected with the first terminal of the second conductive part to form a first connection node of the at least three connection nodes, the second terminal of the first sub-conductive portion is connected with the first terminal of the second sub-conductive portion to form a second connection node of the at least three connection nodes, and the second connection node is connected to a position between the first terminal and the second terminal of the second conductive part, the second terminal of the second sub-conductive portion is connected with the second terminal of the second conductive part to form a third connection node of the at least three connection nodes.

7. The display panel according to claim 6, for any two adjacent hollow patterns of the plurality of hollow patterns, the first connection node formed by the first terminal of the first sub-conductive portion in one of the two adjacent hollow patterns and the first terminal of the second conductive part in the one of the two adjacent hollow patterns is connected with the third connection node formed by the second terminal of the second sub-conductive portion in the other hollow pattern of the two adjacent hollow patterns and the second terminal of the second conductive part in the other hollow pattern.

8. The display panel according to claim 7, wherein each of the first sub-conductive portion, the second sub-conductive portion and the second conductive part comprises an arc shape.

9. The display panel according to claim 1, wherein any two adjacent hollow patterns of the plurality of hollow patterns form a centrally symmetric pattern.

10. The display panel according to claim 1, wherein any two adjacent hollow patterns of the plurality of hollow patterns form an axially symmetric pattern.

11. The display panel according to claim 1, wherein a plurality of first conductive parts of the plurality of hollow patterns comprising the first conductive part form an integrated structure.

12. The display panel according to claim 1, wherein a plurality of second conductive parts of the plurality of hollow patterns comprising the second conductive part form an integrated structure.

13. The display panel according to claim 1, wherein the display panel further comprises a plurality of first fan-out wires between the display area and the bending area, each of the plurality of first fan-out wires is electrically connected with a corresponding data line of the plurality of data lines and a corresponding wiring structure of the plurality of wiring structures, respectively.

14. The display panel according to claim 13, wherein the display panel further comprises a plurality of second fan-out wires, the plurality of second fan-out wires is located between the plurality of pads and the plurality of wiring structures and electrically connected with the plurality of pads and the plurality of wiring structures.

15. The display panel according to claim 14, wherein at least some of the plurality of wiring structures comprises a first sub-wiring and a second sub-wiring, the first sub-wiring and the second sub-wiring are connected in parallel with each other.

16. The display panel according to claim 15, wherein each of the first sub-wiring and the second sub-wiring comprises a first terminal and a second terminal, the first terminal of the first sub-wiring and the first terminal of the second sub-wiring are connected with a corresponding first fan-out wire of the plurality of first fan-out wires, the second terminal of the first sub-wiring and the second terminal of the second sub-wiring are connected with a corresponding second fan-out wire of the plurality of second fan-out wires.

17. A display device, comprising the display panel according to claim 1.

18. The display device according to claim 17, wherein the first conductive part and the second conductive part of the hollow pattern both comprise a first terminal and a second terminal, wherein the first terminal of the first conductive part is connected with the first terminal of the second conductive part, and the second terminal of the first conductive part is connected with the second terminal of the second conductive part, such that first conductive part and the second conductive part are connected with each other to form a closed pattern.

19. The display device according to claim 18, wherein the first conductive part comprises a bending segment, the second conductive part comprises an arc segment, a length of the bending segment extends between the first terminal and the second terminal of the first conductive part, a length of the arc segment extends between the first terminal and the second terminal of the second conductive part, such that the bending segment and the arc segment form the closed pattern.

* * * * *